(12) United States Patent
Tsuji

(10) Patent No.: US 9,546,425 B2
(45) Date of Patent: Jan. 17, 2017

(54) MEMBER HAVING HYDROGEN-CONTAINING, HARD, AMORPHOUS CARBON COATING AND ITS PRODUCTION METHOD

(75) Inventor: Katsuhiro Tsuji, Kashiwazaki (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 1217 days.

(21) Appl. No.: 13/520,998

(22) PCT Filed: Jan. 17, 2011

(86) PCT No.: PCT/JP2011/050670
§ 371 (c)(1),
(2), (4) Date: Jul. 6, 2012

(87) PCT Pub. No.: WO2011/090002
PCT Pub. Date: Jul. 28, 2011

(65) Prior Publication Data
US 2012/0282461 A1    Nov. 8, 2012

(30) Foreign Application Priority Data
Jan. 19, 2010 (JP) ................................. 2010-008923

(51) Int. Cl.
*C23C 14/24* (2006.01)
*B32B 9/00* (2006.01)
(Continued)

(52) U.S. Cl.
CPC ............... *C23C 30/00* (2013.01); *B82Y 30/00* (2013.01); *C01B 3/0021* (2013.01); *C01B 31/02* (2013.01);
(Continued)

(58) Field of Classification Search
CPC ....... C23C 14/0605; C23C 16/26; C01B 31/02
See application file for complete search history.

(56) References Cited

U.S. PATENT DOCUMENTS

| 5,401,543 A | 3/1995 | O'Neill et al. |
| 2001/0024737 A1 | 9/2001 | Utsumi et al. |

(Continued)

FOREIGN PATENT DOCUMENTS

| JP | 2001-261318 A | 9/2001 |
| JP | 2001-316800 A | 11/2001 |

(Continued)

OTHER PUBLICATIONS

Panwar et al, Effect of high substrate bias and hydrogen and nitrogen incorporation on filtered cathodic vacuum arc deposited tetrahedral amorphous carbon films, 2008, ScienceDirect, Thin Solid Films 516, pp. 2331-2340.*

(Continued)

*Primary Examiner* — Monique Jackson
(74) *Attorney, Agent, or Firm* — Birch, Stewart, Kolasch & Birch, LLP

(57) ABSTRACT

In a member having a hydrogen-containing, amorphous carbon coating having a relatively smooth surface, similarly amorphous, fine carbon particles are dispersed in the hydrogen-containing, amorphous carbon coating to have improved cracking resistance while keeping smoothness on the surface and hardness in the entire coating. Specifically, fine particles discharged from a carbon cathode of an arc evaporation source by arc discharge are introduced into the coating, so that similarly amorphous, fine carbon particles are dispersed in the hydrogen-containing, amorphous carbon coating.

4 Claims, 5 Drawing Sheets

(51) Int. Cl.
  *C23C 30/00* (2006.01)
  *B82Y 30/00* (2011.01)
  *C01B 3/00* (2006.01)
  *C01B 31/02* (2006.01)
  *C23C 16/26* (2006.01)
  *C23C 16/505* (2006.01)
  *C23C 14/00* (2006.01)
  *C23C 14/02* (2006.01)
  *C23C 14/06* (2006.01)

(52) U.S. Cl.
  CPC ......... *C23C 14/0021* (2013.01); *C23C 14/025* (2013.01); *C23C 14/0605* (2013.01); *C23C 16/26* (2013.01); *C23C 16/505* (2013.01); *Y02E 60/325* (2013.01); *Y10T 428/268* (2015.01)

(56) References Cited

U.S. PATENT DOCUMENTS

| | | | |
|---|---|---|---|
| 2001/0031346 A1 | 10/2001 | Iwamura | |
| 2002/0004426 A1* | 1/2002 | Lin et al. | 473/324 |
| 2004/0220667 A1* | 11/2004 | Gelfandbein | A61F 9/007 623/6.56 |
| 2006/0210467 A1* | 9/2006 | Smith | B82Y 30/00 423/447.3 |

FOREIGN PATENT DOCUMENTS

| | | |
|---|---|---|
| JP | 2002-212714 A | 7/2002 |
| JP | 2003-82458 A | 3/2003 |
| JP | 2004-249412 A | 9/2004 |
| JP | 2006-283134 A | 10/2006 |
| JP | 2007-126754 A | 5/2007 |
| JP | 2007-136611 A | 6/2007 |
| JP | 2009-220238 A | 10/2009 |
| WO | WO 2008015016 A1 * | 2/2008 ........... C23C 14/025 |
| WO | WO 2009/116552 A1 | 9/2009 |

OTHER PUBLICATIONS

PCT/ISA/210—International Search Report mailed Mar. 15, 2011, issued in PCT/JP2011/050670.

Notification of Reasons for Refusal issued Jan. 6, 2015, in Japanese Patent Application No. 2010-008923, with English translation.

Charrier et al., "Carbon films deposited by the physical vapour deposition focused-arc evaporation technique," Diamond and Related Materials, vol. 3, Issues 1-2, Jan. 1994, pp. 41-46.

Extended European Search Report, dated Jul. 16, 2015, for European Application No. 11734608.0.

Kimura et al., "Microstructure of diamond-like carbon films prepared by cathodic arc deposition," Diamond and Related Materials, vol. 11, Issue 7, Jul. 2002, pp. 1436-1440.

Richter et al., "Preparation and properties of amorphous carbon and hydrocarbon films," Thin Solid Films, vol. 212, Issues 1-2, May 15, 1992, pp. 245-250.

Scheibe et al., "DLC film deposition by Laser-Arc and study of properties," Thin Solid Films, vol. 246, Issues 1-2, Jun. 15, 1994, pp. 92-102.

\* cited by examiner

US 9,546,425 B2

MEMBER HAVING HYDROGEN-CONTAINING, HARD, AMORPHOUS CARBON COATING AND ITS PRODUCTION METHOD

FIELD OF THE INVENTION

The present invention relates to a member having a hydrogen-containing, hard, amorphous carbon coating, particularly to a member having a hydrogen-containing, hard, amorphous carbon coating having good wear resistance suitable for use under high load conditions like engine parts, etc., and its production method.

BACKGROUND OF THE INVENTION

High power, long life and high fuel efficiency are recently required for internal engines such as automobile engines, needing the reduction of friction loss in sliding portions. Thus, hard, amorphous carbon coatings having low friction coefficients are proposed.

Among them, a plasma CVD method and a reactive sputtering method using plasma formed by exciting reactive hydrocarbon gases such as methane, acetylene, etc. introduced into a vacuum chamber, by high-frequency discharge, direct current discharge, etc., can form hydrogen-containing, hard, amorphous carbon coatings having relatively smooth surfaces.

Such hydrogen-containing, hard, amorphous carbon coatings formed on sliding members such as engine parts should indispensably have high wear resistance. Many proposals have been made therefor. For example, JP 2006-283134 A discloses the addition of Si to a hydrogen-containing, hard, amorphous carbon coating, JP 2001-316800 A discloses a method for forming a metal-containing, hard, amorphous carbon coating, and JP 2001-261318 A discloses a method for adding graphite clusters to a hard, amorphous carbon coating.

In hydrogen-containing hard carbon coatings, part of carbon bonds constituting the coatings are terminated by hydrogen regardless of the production method. Accordingly, the hydrogen-containing hard carbon coatings fail to have as strong carbon bonds as those in hard, amorphous carbon coatings containing no hydrogen, suffering faster wearing when formed on sliding members used under a high load. This appears to be due to the mechanism that weak carbon bonds in the hard, amorphous carbon coating are broken by a sliding load, resulting in worn powder detached from the coating.

In the hard, amorphous carbon coating containing graphite clusters, Van der Waals bonds of graphite contained are weaker than sp2 and sp3 bonds of carbon atoms constituting the matrix, reducing the wear resistance of the coating. Even coatings to which metal elements are added have lower hardness than that of hard, amorphous carbon coatings containing no metal elements, indicating that the metal elements do not have a high function of improving wear resistance.

Unlike other metal elements, Si forms a stronger covalent bond to carbon, resulting in improved hardness. However, because only sp3 bond is used, some Si atoms are not fully bonded, resulting in brittle coatings, which are easily cracked.

OBJECTS OF THE INVENTION

Accordingly, an object of the present invention is to provide a member having a hydrogen-containing, hard, amorphous carbon coating having good wear resistance suitable for engine parts, etc. usable under high-load conditions. Another object of the present invention is to provide a method for producing a member having a hydrogen-containing, hard, amorphous carbon coating having excellent wear resistance even under high-load conditions.

DISCLOSURE OF THE INVENTION

The present invention utilizes a hydrogen-containing, amorphous carbon coating basically having a relatively smooth surface. Specifically, this hydrogen-containing, amorphous carbon coating having a structure in which similarly amorphous, fine carbon particles are dispersed has improved cracking resistance with its entire surface kept smooth and hard, thereby having improved wear resistance. As a result of intensive research, the inventor has found that with fine particles discharged from a carbon cathode of an arc evaporation source by arc discharge introduced into a hydrogen-containing, amorphous carbon coating, similarly amorphous, fine carbon particles can be dispersed in the coating.

FIG. 6 schematically shows an arc spot in an arc evaporation source having a carbon cathode. Hot electrons are discharged from arc spots 110 of the carbon cathode 100 during arc discharge, and the arc discharge is maintained by electron flows 141 to an anode 101. A plasma column 140 is formed in front of the arc spots 110, functioning to maintain carbon ion flows 120. Most of ionized carbon discharged from the carbon cathode 100 forms forward carbon ion flows 120, but part of carbon ions move back to the carbon cathode 100 as rearward carbon ion flows 121 by an electric field formed by the plasma column 140, thereby forming amorphous carbon 130 substantially composed of carbon and hydrogen on the carbon cathode 100. It is known that a kinetic speed of arc spots on a cathode evaporation surface in arc discharge is extremely slower when a carbon cathode is used than when a metal cathode is used. Accordingly, when the carbon cathode is used, the rearward carbon ion flows 121 make thicker accumulation of amorphous carbon 130 than when the metal cathode is used. This amorphous carbon 130 ejects fine, amorphous carbon particles 131 by impact by arc discharge.

The present invention utilizes fine, amorphous carbon particles formed by the above mechanism. Namely, the member having a hydrogen-containing, hard, amorphous carbon coating according to the present invention has a hydrogen-containing, hard, amorphous carbon coating, in which fine, amorphous carbon particles substantially composed of carbon and hydrogen and having an average particle size of 0.05-0.5 μm are dispersed. As described above, the fine, amorphous carbon particles substantially composed of carbon and hydrogen are fine particles discharged from a carbon cathode by arc discharge, and the fine particles are introduced into a hydrogen-containing, amorphous carbon coating formed on a substrate. The term "fine, amorphous carbon particles substantially composed of carbon and hydrogen" used herein means that the fine, amorphous carbon particles are composed of 98 atomic % or more of carbon except for hydrogen in a quantitative composition analysis of elements by energy dispersive X-ray spectroscopy (EDX), etc. It is clear that hydrogen is contained in the hard carbon coating because a hydrogen or hydrocarbon gas is introduced during the production of the coating, and the existence of hydrogen can be confirmed by secondary ion mass spectrometry (SIMS). If the fine, amorphous carbon particles contain more hydrogen than the coating matrix does, the fine, amorphous carbon particles would have smaller density than that of the matrix, so that they are bright, for instance, in a bright-field image by a transmission electron microscope as described below. Oppositely, if the fine, amorphous carbon particles contain less hydrogen than the coating matrix does, the fine, amorphous carbon particles would have larger density than that of the matrix, so that they are dark in a bright-field image by a transmission electron microscope. In view of the above, the "particles" in the present invention are particle-like regions surrounded by boundaries of a different-brightness matrix in a bright-field image by a transmission electron microscope. In the present invention, even if the fine, amorphous carbon particles had the same hardness as that of the matrix, high-strength, fine, amorphous carbon particles and/or weak boundaries between the fine, amorphous carbon particles and the matrix contribute to the curving and deflection of cracks, providing the coating with higher toughness and wear resistance.

The member having a hydrogen-containing, hard, amorphous carbon coating according to the present invention is a sliding member such as a piston or a valve for engines, with the above hydrogen-containing, amorphous carbon coating formed on the sliding surface. Specifically, it is suitable for sliding members needing durability, such as pistons, piston rings, cams, valve lifters, shims, valve guides, etc. In this case, the coating is preferably as thick as 3-12 µm.

The method of the present invention for producing a member having a hydrogen-containing, hard, amorphous carbon coating utilizes the peculiar characteristics of arc discharge with an evaporation source comprising a carbon cathode. Namely, using an arc-ion-plating apparatus provided with an arc evaporation source comprising a carbon cathode, arc discharge is conducted with electric current in a range of 45-100 A while introducing a hydrogen and/or hydrocarbon gas. With the electric current for arc discharge controlled in this range, fine, amorphous carbon particles having an average particle size of 0.05-0.5 µm can be ejected efficiently. The electric current is controlled preferably in a range of 50-90 A.

DESCRIPTION OF THE PREFERRED EMBODIMENTS

Figure 1A:
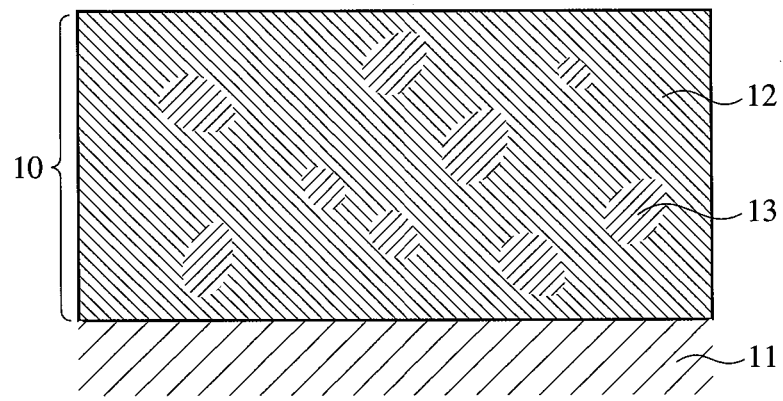
FIG. 1(a) is a view showing a hydrogen-containing, hard, amorphous carbon coating formed on a substrate according to the present invention.
Figure 1B:
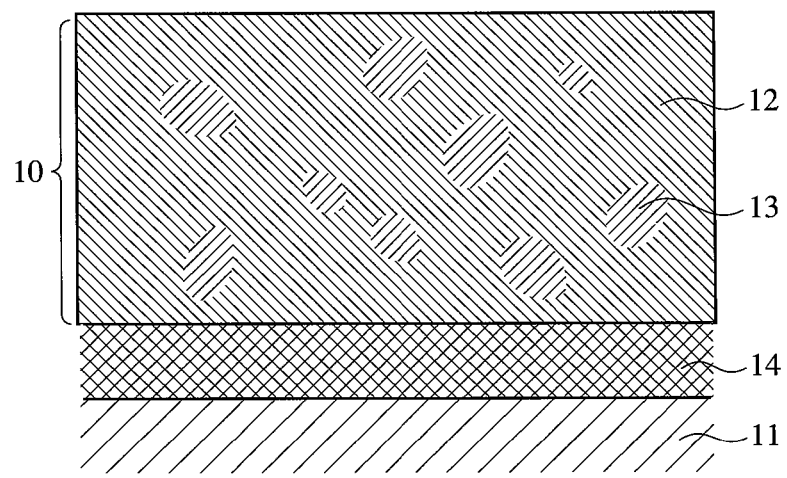
FIG. 1(b) is a view showing a hydrogen-containing, hard, amorphous carbon coating formed on a substrate via an intermediate layer according to the present invention.

FIG. 1 schematically shows the cross section structure of a hydrogen-containing, hard, amorphous carbon coating formed on a substrate. In FIG. 1(a), the hydrogen-containing, hard, amorphous carbon coating 10 is formed on a substrate 11, with similarly amorphous, fine carbon particles 13 dispersed in a matrix 12. In FIG. 1(b), an intermediate layer 14 is formed between the substrate 11 and the hydrogen-containing, hard, amorphous carbon coating 10 to improve their adhesion.

Used for the formation of the hydrogen-containing, hard, amorphous carbon coating 10 is a so-called reactive arc-ion-plating method, which has the elements of a plasma chemical vapor deposition (CVD) method using a hydrocarbon gas as a starting material, and the elements of an arc-ion-plating (AIP) method utilizing the peculiar characteristics of arc discharge using an evaporation source with a carbon cathode.

Fine, amorphous carbon particles can be efficiently scattered particularly by arc discharge with electric current of 45-100 A. In this case, the average particle size of the fine, amorphous carbon particles is in a range of 0.05-0.5 µm. When the electric current of the arc discharge is less than 45 A, it is difficult to keep the arc discharge stably, resulting in higher frequency of stopping the arc discharge. On the other hand, when the electric current of the arc discharge exceeds 100 A, fine carbon particles are so heated that they are undesirably graphitized. Fine, amorphous carbon particles having an average particle size of less than 0.05 µm are not observed by a transmission electron microscope at a magnification of 25,000 times. The average particle size of 0.5 µm or less provides a coating with a relatively smooth surface, so that even the detachment of fine, amorphous carbon particles from the coating by friction would not subject a sliding mate and the coating per se to abrasive wearing. Accordingly, the average particle size of the fine, amorphous carbon particles is 0.05-0.5 µm. Further, the fine, amorphous carbon particles are contained in a proportion of preferably 2-70%, more preferably 20-60%, on an area basis in a cross section in parallel to the coating surface.

Figure 2:
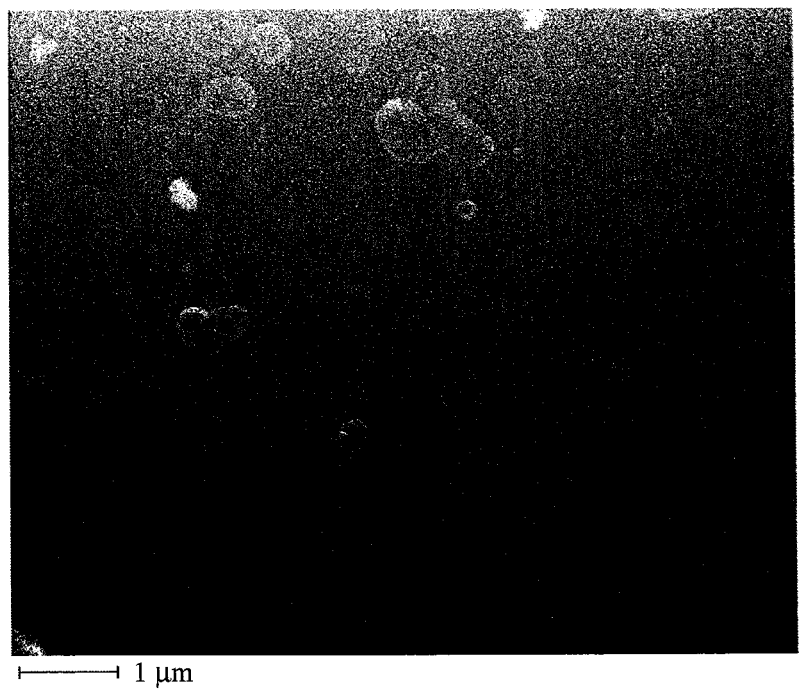
FIG. 2 is a bright-field image by a transmission electron microscope of a planar-cross-section sample of a hydrogen-containing, hard, amorphous carbon coating according to the present invention.
Figure 7:
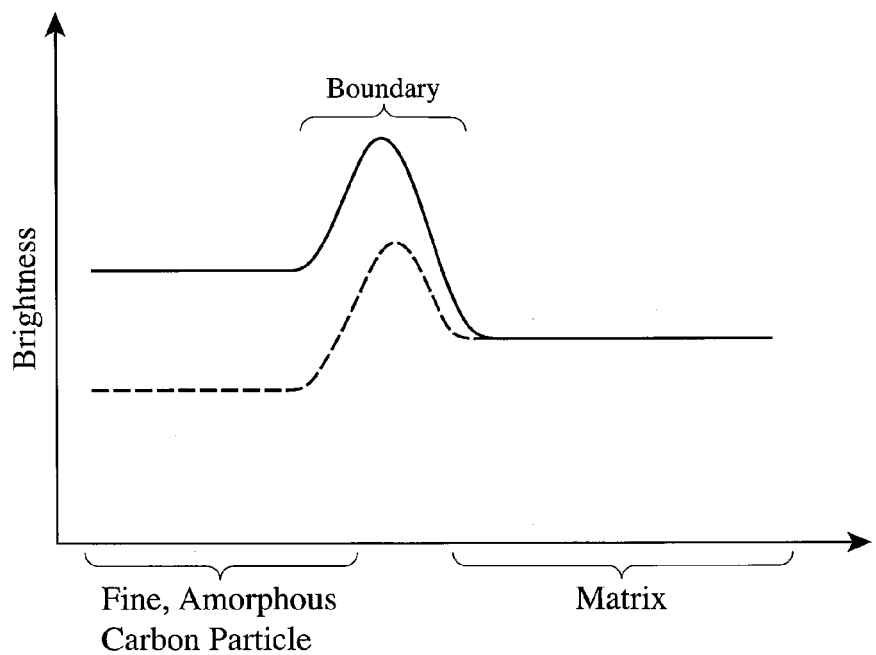
FIG. 7 is a view schematically showing a brightness distribution near a boundary between a fine, amorphous carbon particle and the matrix.

The sizes and shapes of the fine, amorphous carbon particles 13 can be measured by a transmission electron microscope. Thin film samples for transmission-electron-microscopic observation can be easily produced by using focused ion beams (FIB). In the transmission-electron-microscopic observation, the degree of scattering absorption differs depending on the density of a material observed, so that the brightness of image differs depending on the density. FIG. 2 shows a bright-field image of a planar-cross-section sample observed by a transmission electron microscope. The observation is conducted at a magnification providing an image as large as at least 5 µm×5 µm, for example, at 25,000 times. The planar direction means a direction parallel to a surface of the hydrogen-containing, hard, amorphous carbon coating, and the thin sample is taken from a thickness-direction center portion of the coating. In this bright-field image, fine carbon particles are observed as different-size, particulate specks. Many of them are slightly brighter than the matrix, and have almost spherical shapes. Some fine particles have inner portions having substantially the same brightness as that of the matrix, and fringes brighter than the surrounding matrix. Droplets (graphite) peculiar to the arc-ion-plating existing in the coating look white as a whole, differing from the fine, amorphous carbon particles. There are boundaries between the fine, amorphous carbon particles 13 and the matrix, particularly contributing to the deflection of cracking. Because the boundaries have low carbon densities, the fine, amorphous carbon particles 13 have bright fringes in a bright-field image obtained by transmission-electron-microscopic observation. FIG. 7 schematically shows a brightness distribution near a boundary. Though some fine, amorphous carbon particles are brighter or darker than the matrix, the boundaries brighter than them provide the brightest fringes defining the contours of fine, amorphous carbon particles 13, enabling the determination of their sizes and shapes.

Based on these contour images, the sizes (particle sizes) of the fine, amorphous carbon particles and an area ratio of the fine, amorphous carbon particles to the entire coating are determined. The size (particle size) of each fine, amorphous carbon particles is defined as being equal to a diameter of a circle having the same area as that of the fine, amorphous carbon particle, and their average value is calculated.

Figure 3:
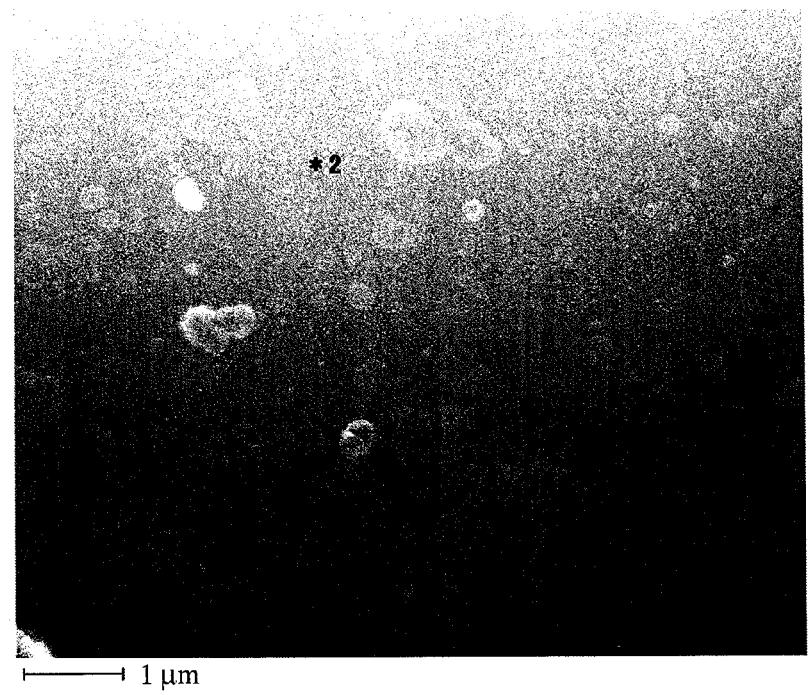
FIG. 3 is a bright-field image of the sample of FIG. 2, in which positions for observing electron beam diffraction images are marked, *1 indicating the observing position of a fine, amorphous carbon particle, and *2 indicating the observing position of the coating matrix.
Figure 4:
FIG. 4 is an electron beam diffraction image observed at the position *1 in FIG. 3.
Figure 5:
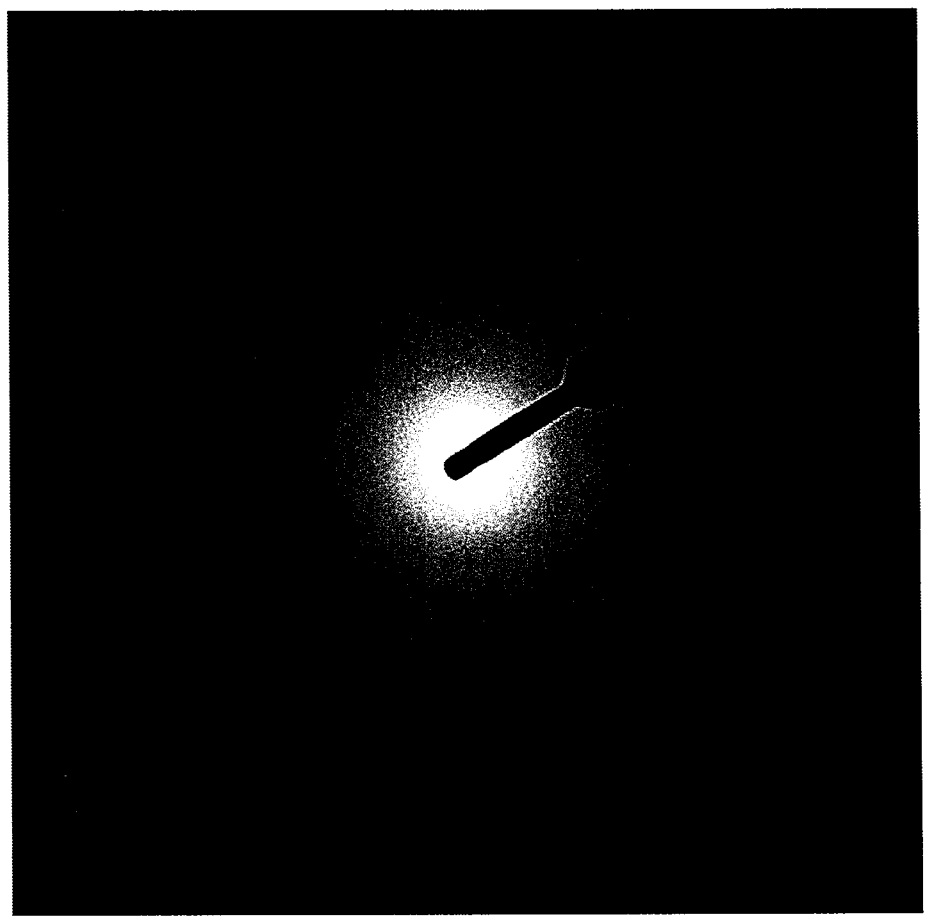
FIG. 5 is an electron beam diffraction image observed at the position *2 in FIG. 3.
Figure 6:
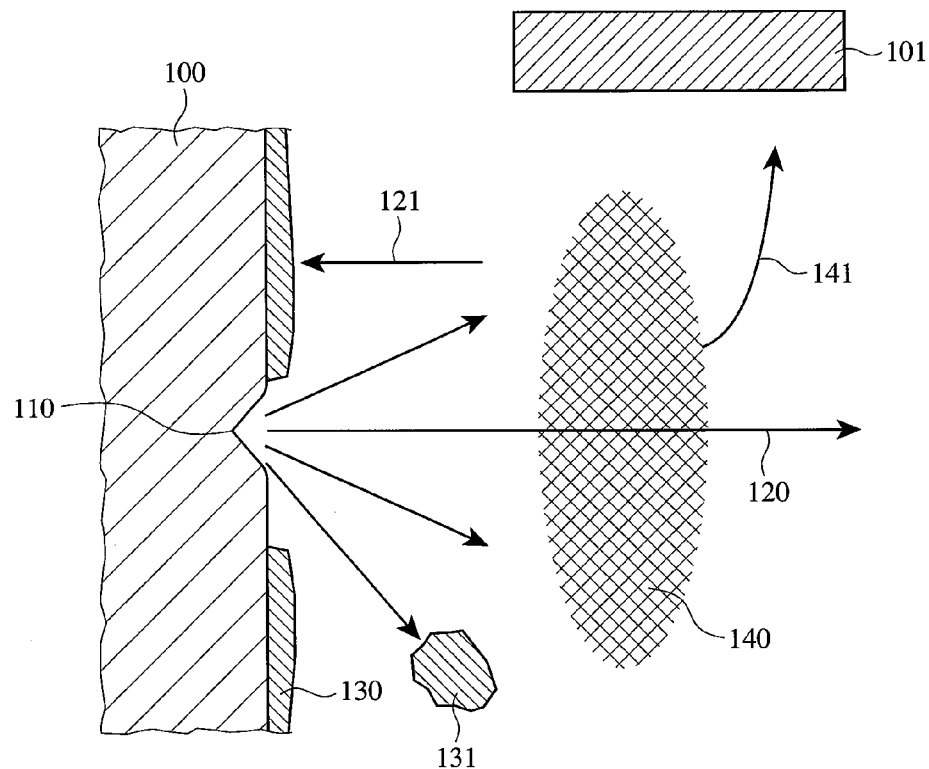
FIG. 6 is a view schematically showing a region surrounding an arc spot on a carbon cathode surface in an arc evaporation source comprising a carbon cathode.

The requirement of the present invention that fine carbon particles are amorphous is confirmed by halo without particular bright spots or bright rings such as Debye-Scherrer rings in an electron beam diffraction image by transmission-electron-microscopic observation. FIG. 4 shows an electron beam diffraction image at the position *1 in FIG. 3, at which a fine carbon particle exists. A halo pattern was observed, confirming that a fine carbon particle at the position *1 was amorphous. FIG. 5 shows an electron beam diffraction image at the position *2 in the matrix in FIG. 3. In this case, too, a halo pattern was observed, confirming that the matrix at the position *2 was amorphous.

Even though the fine, amorphous carbon particles have substantially the same density and hardness as those of the hydrogen-containing amorphous hard carbon matrix, their dispersion can suppress the brittleness of a homogeneous, hydrogen-containing, hard, amorphous carbon coating free of fine, amorphous carbon particles, because their average particle size is as small as 0.05-0.5 μm. Though the dispersion of fine, amorphous carbon particles makes the entire coating inhomogeneous, it causes the curving and deflection of cracks in their propagation, resulting in higher fracture toughness. In other words, a structure needing additional energy for fracture provides the member having a hydrogen-containing, hard, amorphous carbon coating with high hardness, high toughness and improved wear resistance. The matrix containing the fine, amorphous carbon particles is not restricted to a homogeneous coating. As long as the amorphous carbon coating is composed substantially of carbon and hydrogen, it may have, for example, a laminate structure in which bright portions and dark portions are repeated in a transmission-electron-microscopic image. The coating having a laminate matrix has a reduced residual stress, as well as high fracture toughness because smaller-density layers (brighter portions) in the laminate structure strongly deflect cracks advancing in a thickness direction.

To exhibit excellent wear resistance peculiar to the hydrogen-containing, hard, amorphous carbon coating, the hydrogen-containing, hard, amorphous carbon coating according to the present invention should have excellent adhesion to a substrate. To improve the adhesion, known methods can be used. The intermediate layer, if any, is preferably made of Cr, Ti, SiC or WC.

In the method of the present invention for producing a member having a hydrogen-containing, hard, amorphous carbon coating, a hydrogen gas and/or a hydrocarbon gas are used in a so-called reactive arc-ion-plating method. To accelerate the dissociation of a hydrocarbon gas, an inert gas such as argon, etc. may be introduced. Usable as the hydrocarbon gas are one or more materials selected from those in a gaseous state at room temperature, such as methane, ethane, acetylene, etc., and liquids vaporizable at a reduced pressure of 10 Pa or less, such as benzene, etc. Plasma generated by arc discharge has a high degree of electrolytic dissociation, efficiently dissociating a reactive gas such as methane, acetylene, etc. introduced to form a hard carbon coating. This provides high densities of atoms and molecules contributing to the formation of a hard carbon coating, increasing the production speed of the coating. As a result, the coating time can be reduced, resulting in high productivity.

The present invention will be explained in more detail referring to specific examples below.

Example 1

One surface of a hardened, high-speed tool steel disk made of SKH51 of JIS G4403 (diameter: 24 mm, and thickness: 4 mm) for a substrate was ground to have surface roughness Rz (10-point average roughness of JIS B0601-1994) of 0.3-0.5 μm. Immediately before coating, it was subject to ultrasonic cleaning with acetone and ethanol successively, to remove stains from the surface. With this disk set in a reactive arc-ion-plating apparatus comprising a chromium (Cr) cathode and a graphite cathode, ion bombardment was conducted after evacuation, and an intermediate Cr layer was then formed. Next, an argon gas and an acetylene gas were introduced to form a hard carbon coating by a reactive arc-ion-plating method, under the conditions that arc discharge current was 80 A, and that pulse bias having a peak voltage of −50 V, a frequency of 250 kHz and an On/Off ratio of 1.0 was applied while evaporating the graphite cathode (carbon: 98 atomic % or more) by arc discharge. The resultant coating was as thick as about 7 μm.

To evaluate the wear resistance of the resultant member having a hydrogen-containing, hard, amorphous carbon coating, a ball-on-disk test was conducted by Tribometer available from CSM Instruments. The test conditions are shown in Table 1.

TABLE 1

| Items | Test Conditions |
|---|---|
| Ball | SUJ2 (diameter: 6 mm) |
| Load | 10N |
| Sliding speed | 10 mm/sec |
| Rotation radius | 5 mm |
| Sliding distance | 120 m |
| Sliding environment | No lubricant |

After the test, a surface shape of the sliding portion was measured by a stylus in a direction perpendicular to a sliding direction, to evaluate the wear depth of the coating. The diameter of a worn portion of the ball (SUJ2 of JIS G4805), a sliding mate, was also measured. Further, by the observation of the coating by a transmission electron microscope, the average particle size, etc. of fine, amorphous carbon particles were measured. As a result, the wear depth of the coating was 1 μm, a worn portion of the ball had a diameter of 1 μm, and the fine, amorphous carbon particles had an average particle size of 0.23 μm and an area ratio of 11.7%. Halo was observed in an electron diffraction image of the fine carbon particles. Of course, halo was also observed in an electron diffraction image of the matrix.

Example 2

An intermediate Ti layer was formed under the same conditions as in Example 1 except for changing the chromium (Cr) cathode to a titanium (Ti) cathode. Thereafter, a hydrogen gas and a methane gas were introduced in place of the argon gas and the acetylene gas in Example 1, to form a hard carbon coating by a reactive arc-ion-plating method under the same bias conditions as in Example 1. The arc discharge current was 65 A.

Example 3

With the same disk substrate as in Example 1 set in the apparatus, an argon gas and a tetramethylsilane (TMS) gas were introduced to form an intermediate silicon carbide (SiC) layer by a plasma CVD method. Thereafter, an argon gas and benzene were introduced to form a hard carbon coating by a reactive arc-ion-plating method at a reduced pressure of 10 Pa or less with pulse bias having a peak voltage of −100 V, a frequency of 200 kHz and an On/Off ratio of 0.3. The arc discharge current was 100 A.

Example 4

An intermediate Cr layer was formed under the same conditions as in Example 1, and an argon gas and an acetylene gas were introduced to form a hard carbon coating by a reactive arc-ion-plating method. The arc discharge current was 45 A.

Comparative Example 1

The same disk substrate as in Example 1 with respect to a material, a size, grinding and washing was set in the apparatus, and an argon gas and an acetylene gas were introduced without forming an intermediate layer, to form a hard carbon coating by a plasma CVD method with a pulse bias having a frequency of 250 kHz, a voltage of −320 V and an On/Off ratio of 1.0 applied to the substrate to excite high-frequency discharge plasma.

Comparative Example 2

After an intermediate Ti layer was formed under the same conditions as in Example 2, a hydrogen gas and a methane gas were introduced to form a hard carbon coating by a reactive sputtering method with a graphite cathode, under the same bias conditions as in Example 1.

Comparative Example 3

A hard carbon coating was formed by a reactive arc-ion-plating method under the same conditions as in Example 1 except for setting the arc discharge current at 120 A.

Comparative Example 4

A hard carbon coating was formed by a reactive filtered arc-ion-plating method using an arc evaporation source equipped with a magnetic filter, under the same conditions as in Example 2 except for changing only the mechanism of the evaporation source.

A ball-on-disk test was conducted under the same conditions as in Example 1 to evaluate the wear resistance of the members of Examples 2-4 and Comparative Examples 1-4 each having a hydrogen-containing, hard, amorphous carbon coating. The results are shown in Table 2 together with those of Example 1.

TABLE 2

| No. | Wear Depth (μm) | Diameter of Worn Portion of Ball (μm) | Fine Carbon Particles | | | Matrix Halo[1] |
|---|---|---|---|---|---|---|
| | | | Average Diameter (μm) | Area Ratio (%) | Halo[1] | |
| Example 1 | 1 | 1 | 0.23 | 11.7 | Yes | Yes |
| Example 2 | ≤0.1 | 1 | 0.05 | 3.2 | Yes | Yes |
| Example 3 | 0.8 | 1.2 | 0.41 | 29.6 | Yes | Yes |
| Example 4 | 1.1 | 1.5 | 0.49 | 66.8 | Yes | Yes |
| Comparative Example 1 | 11 | 5 | Not Observed | — | — | Yes |
| Comparative Example 2 | 9 | 4 | Not Observed | — | — | Yes |
| Comparative Example 3 | 6 | 8 | 0.73 | 31.3 | No | Yes |
| Comparative Example 4 | 3[2] | 4 | Not Observed | — | — | Yes |

Note:
[1]Halo in the electron diffraction image.
[2]The depth of cracks in the coating is shown.

Table 2 indicates that the matrices of Examples and Comparative Examples were composed of amorphous carbon because of halo in their electron beam diffraction images. Fine, amorphous carbon particles exhibiting halo in their electron beam diffraction images were dispersed in the hard carbon coatings of Examples. It was confirmed that the fine, amorphous carbon particles provided the hard carbon coatings with good wear resistance, and little attack to sliding mates. Also, no defects such as cracks were observed in the sliding portions of the coatings. On the other hand, the coatings of Comparative Examples 1-4, in which fine, amorphous carbon particles were not dispersed, suffered larger wear depths than those of Examples 1-4, indicating poorer wear resistance. The coating of Comparative Example 4 was partially detached by cracking in an area on which a ball (sliding mate) slid. The hard carbon coating of Comparative Example 3, in which fine carbon particles exhibiting no halo in their electron diffraction images and having an average particle size of more than 0.5 μm were dispersed, had poor wear resistance, a rough sliding surface because of the detachment of large dispersed particles, and large attack to a sliding mate.

EFFECT OF THE INVENTION

Because the member having a hydrogen-containing, hard, amorphous carbon coating according to the present invention has fine, amorphous carbon particles having an average particle size of 0.05-0.5 μm dispersed in the hydrogen-containing amorphous coating, high-strength, fine, amorphous carbon particles and/or weak boundaries between the fine, amorphous carbon particles and the matrix contribute to the curving and deflection of cracks, so that the coating has improved cracking resistance and thus excellent wear resistance. Particularly when it is used as engine parts subject to high-load sliding, it exhibits extremely high wear resistance. Also, the hydrogen-containing, hard, amorphous carbon coating has a relatively smooth surface as a whole, exhibiting excellent sliding characteristics with a small friction coefficient. Further, because this coating is formed by a so-called reactive arc-ion-plating method at a high speed, its productivity is extremely high as a method for forming an amorphous carbon coating.

What is claimed is:

1. A member comprising:
    a substrate; and
    a hydrogen-containing, hard, amorphous carbon coating formed of a matrix phase and a dispersion phase, wherein
    the amorphous carbon coating is formed on a surface of the substrate
    the matrix phase is substantially composed of carbon and hydrogen,
    fine, amorphous carbon particles substantially composed of carbon and hydrogen and having an average particle size of 0.05-0.5 μm are dispersed, as the dispersion phase, in the matrix phase, and
    the amount of said fine, amorphous carbon particles is 2-70% on an area basis in a cross section in parallel to its surface.

2. The member according to claim 1, wherein said fine, amorphous carbon particles are fine particles discharged from a carbon cathode by arc discharge.

3. The member according to claim 1, wherein in a bright-field image of said hydrogen-containing, hard, amorphous carbon coating observed by a transmission electron microscope, said fine, amorphous carbon particles are brighter or darker than the matrix.

4. A member comprising:
    a substrate; and
    a hydrogen-containing, hard, amorphous carbon coating formed of a matrix phase and a dispersion phase, wherein
    the amorphous carbon coating is formed on a surface of the substrate,
    the matrix phase is homogeneous and substantially composed of carbon and hydrogen,
    fine, amorphous carbon particles substantially composed of carbon and hydrogen and having an average particle size of 0.05-0.5 μm are dispersed, as the dispersion phase, in the homogeneous matrix phase, and
    the amount of said fine, amorphous carbon particles is 20-60% on an area basis in a cross section in parallel to its surface.

* * * * *